(12) United States Patent
Miwa et al.

(10) Patent No.: US 10,134,959 B2
(45) Date of Patent: Nov. 20, 2018

(54) LIGHT EMITTING DEVICE EXCELLENT IN COLOR RENDERING PROPERTY FOR EMITTING LIGHT CLOSER TO SUNLIGHT

(71) Applicant: TOYODA GOSEI CO., LTD., Kiyosu-shi (JP)

(72) Inventors: Tomohiro Miwa, Kiyosu (JP); Shota Shimonishi, Kiyosu (JP); Shigeo Takeda, Kiyosu (JP); Satomi Seki, Kiyosu (JP); Daisuke Kato, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/820,142

(22) Filed: Nov. 21, 2017

(65) Prior Publication Data

US 2018/0254387 A1 Sep. 6, 2018

(30) Foreign Application Priority Data

Mar. 1, 2017 (JP) .................................. 2017-038517

(51) Int. Cl.
*H01L 33/50* (2010.01)
*H01L 33/56* (2010.01)
*H01L 33/48* (2010.01)
*H01L 33/62* (2010.01)
*H01L 33/54* (2010.01)

(52) U.S. Cl.
CPC .......... *H01L 33/504* (2013.01); *H01L 33/507* (2013.01); *H01L 33/486* (2013.01); *H01L 33/54* (2013.01); *H01L 33/56* (2013.01); *H01L 33/62* (2013.01)

(58) Field of Classification Search
CPC ........................... H01L 33/504; H01L 33/507
See application file for complete search history.

(56) References Cited

U.S. PATENT DOCUMENTS 8,071,988 B2 * 12/2011 Lee .................... H01L 25/0753
257/88
2010/0283381 A1 * 11/2010 Takahashi ............. C04B 35/597
313/503

FOREIGN PATENT DOCUMENTS

JP        2016-111190 A   6/2016
JP        2016-157965 A   9/2016

* cited by examiner

*Primary Examiner* — Andrew Q Tran
(74) *Attorney, Agent, or Firm* — McGinn IP Law Group, PLLC.

(57) ABSTRACT

A light emitting device includes a first phosphor emitting a fluorescence having a peak emission wavelength of not less than 445 nm and not more than 490 nm, a second phosphor emitting a fluorescence having a peak emission wavelength of not less than 491 nm and not more than 600 nm, a third phosphor emitting a fluorescence having a peak emission wavelength of not less than 601 nm and not more than 670 nm, and a light emitting element that emits a light having a peak emission wavelength at a shorter wavelength side than the peak emission wavelength of the first phosphor. $0.586 \leq x \leq 0.734$, $0.017 \leq y \leq 0.081$, $0.239 \leq z \leq 0.384$ and $x+y+z=1$ are satisfied, where x, y, z are defined as mass ratios of the first, second and third phosphors, respectively, to a total mass of the first, second and third phosphors.

8 Claims, 3 Drawing Sheets

LIGHT EMITTING DEVICE EXCELLENT IN COLOR RENDERING PROPERTY FOR EMITTING LIGHT CLOSER TO SUNLIGHT

The present application is based on Japanese patent application No. 2017-038517 filed on Mar. 1, 2017, the entire contents of which are incorporated herein by reference.

BACKGROUND OF THE INVENTION

1. Field of the Invention

This invention relates to a light emitting device.

2. Description of the Related Art

A light emitting device is known that is provided with a light emitting element having a peak emission wavelength ranging 400 nm to 460 nm and a phosphor, and emits a mixed light of light emitted from the light emitting element and fluorescence emitted from the phosphor. The mixed light is not less than 85 in general color rendering index Ra and not less than 50 in special color rendering index R9 (red) (see e.g. JP 2016/111190A).

Also, a light emitting device is known that is provided with a light emitting element having a peak emission wavelength ranging a near-ultraviolet to a blue region and a phosphor. The mixed light is 90 to 97 in general color rendering index Ra (see e.g. JP 2016/157965A).

Meanwhile, the general color rendering index Ra and the special color rendering index R9 are parameters for evaluating by quantification the color rendering property thereof. It is deemed that according as the parameters of light come close to 100, the light comes close to a reference light such as the sunlight.

SUMMARY OF THE INVENTION

It is an object to provide a light emitting device that is excellent in color rendering property so as to emit a light closer to the sunlight in the evening than the known light emitting device.

According to an embodiment of the invention, a light emitting device defined by [1] to [5] below is provided.

[1] A light emitting device, comprising:
a first phosphor emitting a fluorescence having a peak emission wavelength of not less than 445 nm and not more than 490 nm;
a second phosphor emitting a fluorescence having a peak emission wavelength of not less than 491 nm and not more than 600 nm;
a third phosphor emitting a fluorescence having a peak emission wavelength of not less than 601 nm and not more than 670 nm; and
a light emitting element that emits a light having a peak emission wavelength at a shorter wavelength side than the peak emission wavelength of the fluorescence emitted from the first phosphor,
wherein $0.586 \leq x \leq 0.734$, $0.017 \leq y \leq 0.081$, $0.239 \leq z \leq 0.384$ and $x+y+z=1$ are satisfied, where x, y, z are defined as mass ratios of the first, second and third phosphors, respectively, to a total mass of the first, second and third phosphors.

[2] The light emitting device according to [11], wherein the light emitting device emits a light of which color rendering indexes Rf and Rg satisfy $Rf \geq 85$ and $93 \leq Rg \leq 107$, respectively, where a reference light is defined by a light having a color temperature of 2800 to 3200K.

[3] The light emitting device according to [1] or [2], wherein x, y and z satisfy $0.664 \leq x \leq 0.734$, $0.017 \leq y \leq 0.047$ and $0.239 \leq z \leq 0.288$, respectively.

[4] The light emitting device according to [3], wherein the light emitting device emits a light of which color rendering indexes Rf and Rg satisfy $Rf \geq 94$ and $99 \leq Rg \leq 101$, respectively, where a reference light is defined by a light having a color temperature of 2800 to 3200K.

[5] The light emitting device according to any one of [1] to [4], wherein the first phosphor comprises an alkaline earth halophosphate phosphor,
wherein the second phosphor comprises a β-SiAlON phosphor, and
wherein the third phosphor comprises a CASON phosphor.

Effects of the Invention

According to an embodiment of the invention, a light emitting device can be provided that is excellent in color rendering property so as to emit a light closer to the sunlight in the evening than the known light emitting device.

BRIEF DESCRIPTION OF THE DRAWINGS

Next, the present invention will be explained in conjunction with appended drawings, wherein.

DETAILED DESCRIPTION OF THE PREFERRED EMBODIMENTS

Embodiments (Structure of a Light Emitting Device)

Figure 1:
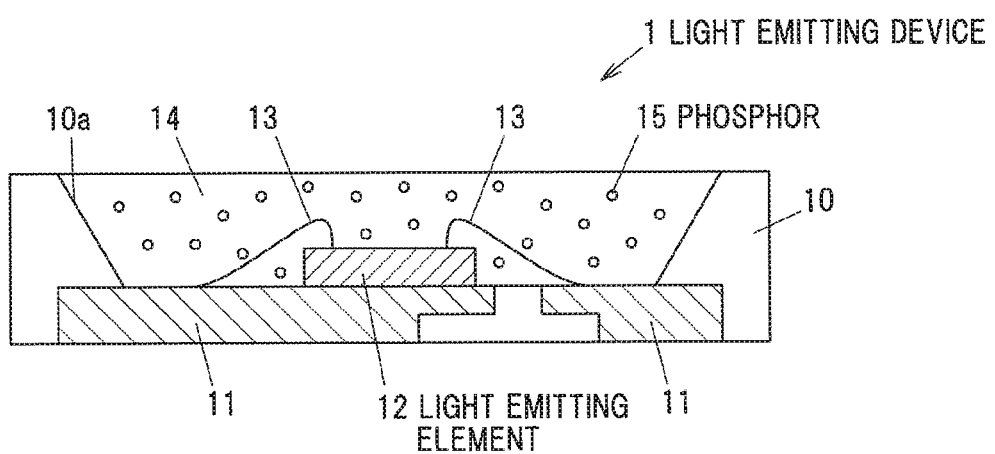
FIG. 1 is a cross sectional view showing a light emitting device according to the embodiment.

FIG. 1 is a vertical cross sectional view showing a light emitting device 1 according to the embodiment. The light emitting device 1 is provided with a case 10 having a recessed portion 10a, a lead frame 11 located in the case 10 so as to be exposed at a bottom of the recessed portion 10a, a light emitting element 12 mounted on the lead frame 11, bonding wire 13 electrically connecting the lead frame 11 and an electrode of the light emitting element 12, sealing resin 14 filled in the recessed portion 10a and sealing the light emitting element 12, and a particle phosphor 15 included in the sealing resin 14.

For example, the case 10 comprises heat plasticity resins such as polyphthalamide resin, Liquid Crystal Polymer (LCP), and Polycyclohexylene Dimethylene Terephalate (PCT), and thermoset resins such as silicone resin, modified silicone resin, epoxy resin, and modified epoxy resin. The case 10 is formed by injection molding or transfer molding. The case 10 may comprise a light reflective particle such as titanium dioxide so as to improve optical reflectance.

For example, the whole or surface of the lead frame 11 comprises conductive materials such as Ag, Cu, and Al.

Typically, the light emitting element 12 is a light emitting diode (LED) element or a laser diode element. As shown in the example in FIG. 1, the light emitting element 12 is a face-up type element connected to the lead frame 11 by the bonding wire 13. Meanwhile, the light emitting element 12 may be a face-down type element and may be connected to the lead frame using a connecting member such as a conductive bump in addition to the bonding wire.

For example, the sealing resin 14 comprises resin materials such as the silicone resin and the epoxy resin.

The phosphor 15 emits fluorescence by the light emitted from the light emitting element 12 as the excitation source. The phosphor 15 is provided with a first phosphor that emits the fluorescence having the peak emission wavelength of not less than 445 nm and not more than 490 nm, a second phosphor that emits the fluorescence having the peak emission wavelength of not less than 491 nm and not more than 600 nm, and a third phosphor that emits the fluorescence having the peak emission wavelength of not less than 601 nm and not more than 670 nm so as to bring the emission spectrum of the light emitting element 1 close to the emission spectrum of the sunlight.

$0.586 \leq x \leq 0.734$, $0.017 \leq y \leq 0.081$, $0.239 \leq z \leq 0.384$, and $x+y+z=1$ are satisfied, where x is defined as a mass ratio of the first phosphor to the total mass of the first, second, and third phosphors, y is defined as a mass ratio of the second phosphor to the total mass of the first, second, and third phosphors, and z is defined as a mass ratio of the third phosphor to the total mass of the first, second, and third phosphors. Under the condition, parameters of the color rendering indexes Rf, Rg in which the light having color temperature of 2800 to 3200K is defined as a reference light can come close to 100.

Moreover, as the above x, y, z satisfy $0.664 \leq x \leq 0.734$, $0.017 \leq y \leq 0.047$, and $0.239 \leq z \leq 0.288$, the parameters of the color rendering indexes Rf, Rg in which the light having the color temperature of 2800 to 3200K is defined as the reference light can come closer to 100.

For example, alkaline earth halophosphate phosphor can be used as the blue phosphor that emits the fluorescence having the peak emission wavelength of not less than 445 nm and not more than 490 nm. Main component of alkaline earth halophosphate phosphor will be shown in Table 1.

TABLE 1

| Phosphor | Main component |
| --- | --- |
| Alkaline earth halophosphate phosphor | $(Ba, Sr, Ca, Mg)_5(PO_4)_3Cl:Eu^{2+}$ <br> $(Ba, Sr, Ca, Mg)_{10}(PO_4)_6Cl_2:Eu^{2+}$ |

Akaline earth halophosphate phosphor can change the emission spectrum by changing concentrations of an activator agent such as Eu or alkaline earth metals such as Ca, Sr, Ba, and Mg.

For example, Ca solid solution α-SiAlON phosphor, β-SiAlON phosphor, Silicate phosphor, Nitride phosphor, LSN phosphor, YAG phosphor, or LuAG phosphor can be used as the yellow-green phosphor that emits the fluorescence having the peak emission wavelength of not less than 491 nm and not more than 600 nm. Main components of these phosphors will be shown in Table 2.

TABLE 2

| Phosphor | Main Component |
| --- | --- |
| Ca solid solution α-SiAlON phosphor | $Ca—Si_{12-(m+n)}Al_{m+n}O_nN_{16-n}$ |
| β-SiAlON phosphor | $Si_{6-z}Al_zO_zN_{8-z}:Eu^{2+}$ |

TABLE 2-continued

| Phosphor | Main Component |
| --- | --- |
| Silicate phosphor | $(Ca, Sr, Ba)_3SiO_5:Eu^{2+}$ <br> $(Ba, Sr, Ca)_2SiO_4:Eu^{2+}$ |
| Nitride phosphor | $(Ca, Sr, Ba)_2Si_5N_8:Eu^{2+}$ |
| LSN phosphor | $(La, Ca)_3Si_6N_{11}:Ce^{3+}$ |
| YAG phosphor | $(Y, Gd)_3(Al, Ga)_5O_{12}:Ce^{3+}$ |
| LuAG phosphor | $Lu_3(Al, Ga)_5O_{12}:Ce^{3+}$ |

YAG phosphor or LuAG phosphor can change the emission spectrum by changing concentrations of Gd, Ga or the activator agent such as Ce.

For example, CASN phosphor, SCASN phosphor, or CASON phosphor can be used as the red phosphor that emits the fluorescence having the peak emission wavelength of not less than 601 nm and not more than 670 nm. Main components of these phosphors will be shown in Table 3.

TABLE 3

| Phosphor | Main Component |
| --- | --- |
| CASN phosphor | $CaAlSiN_3:Eu^{2+}$ |
| SCASN phosphor | $(Sr, Ca)AlSiN_3:Eu^{2+}$ |
| CASON phosphor | $Ca_{1-x}Al_{1-x}Si_{1+x}N_{3-x}O_x:Eu^{2+}$ |

CASN phosphor, SCASN phosphor, and CASON phosphor can change the emission spectrum by changing concentrations of the activator agent such as Eu, or alkaline earth metals such as Sr and Ca.

Combinations and ratio of the concentration of the phosphors included in the phosphor 15 are adjusted such that the emission spectrum of the light emitting device 1 comes close to the emission spectrum of the sunlight. For example, the combinations and the ratio of the concentration of the phosphors included in the phosphor 15 are adjusted such that the color rendering indexes Rf, Rg come close to 100 while the sunlight in the evening having color temperature of 2800 to 3200K is defined as the reference light.

For example, as $0.586 \leq x \leq 0.734$, $0.017 \leq y \leq 0.081$, $0.239 \leq z \leq 0.384$, and $x+y+z=1$ are satisfied, where x is defined as the mass ratio of the first phosphor to the total mass of the first, second, and third phosphors, y is defined as the mass ratio of the second phosphor to the total mass of the first, second, and third phosphors, and z is defined as the mass ratio of the third phosphor to the total mass of the first, second, and third phosphors, the combinations or the ratio of the concentration of the phosphors included in the phosphor 15 are desirably adjusted such that $Rf \geq 94$, and $99 \leq Rg \leq 101$ are satisfied, where Rf, Rg are respectively defined as the color rendering indexes of the light emitted from the light emitting device 1 in which the light having the color temperature of 2800 to 3200K is defined as the reference light.

Also, as the above x, y, z satisfy $0.664 \leq x \leq 0.734$, $0.017 \leq y \leq 0.047$, and $0.2395 \leq z \leq 0.288$, the combinations or the ratio of the concentration of the phosphors included in the phosphor 15 are desirably adjusted such that $Rf \geq 94$, and $99 \leq Rg \leq 101$ are satisfied, where Rf, Rg are respectively defined as the color rendering indexes of the light emitted from the light emitting device 1 in which the light having the color temperature of 2800 to 3200K is defined as the reference light.

The above color rendering indexes Rf, Rg are used in a new light color rendering property evaluation method "TM-30-15" defined by the Illuminating Engineering Society of North America (IES).

Rf is a parameter indicating color fidelity. Rf can evaluate the color fidelity in higher accuracy than the general color rendering index Ra since Rf can be evaluated from 99 types of color tests. The maximum of Rf is defined as 100. It is deemed that according as the color of the test light comes close to 100, the light comes close to the reference light such as the sunlight.

Rg is a parameter indicating color brightness that is not evaluated in the known evaluation method. It is deemed that according as Rg comes close to 100, the color brightness of test light comes close to the color brightness of the reference light such as the sunlight. Rg may be less than 100 or more than 100.

The light emitted from the light emitting element 12 has a peak emission wavelength in a shorter wavelength side from the peak emission wavelength of the fluorescence emitted from the first phosphor since the light emitted from the light emitting element 12 is the excitation source of the phosphor 15.

An emission intensity in a short wavelength region (the violet wavelength region) in the emission spectrum of the light emitting device 1 decreases as the peak emission wavelength of the light emitted from the light emitting element 12 is too long. Thus, it is difficult to bring the emission spectrum of the light of the emitting device 1 close to the emission spectrum of the sunlight. Therefore, the peak emission wavelength of the light emitted from the light emitting element 12 is desirably not more than 450 nm.

Meanwhile, a spectrum trough between a peak of the emission spectrum of the emitting element 12 and a peak of an emission spectrum of the phosphor 15 becomes deeper as the peak emission wavelength of the light emitted from the light emitting element 12 is too short. Thus, it is difficult to bring the emission spectrum of the light emitting device 1 close to the emission spectrum of the sunlight. Therefore, the peak emission wavelength of the light emitted from the light emitting element 12 is desirably not less than 385 nm.

Meanwhile, the structure of the light emitting element 1 is not limited to the structure shown in FIG. 1 as long as the structure is provided with the light emitting element 12 and the phosphor 15.

Advantageous Effect of the Embodiment

According to the above embodiment, a light emitting device that is excellent in color rendering property so as to emit a light closer to the sunlight in the evening than the light emitted from the known light emitting device can be provided.

Examples

Alkaline earth halophosphate phosphor is used as the first phosphor. β-SiAlON phosphor is used as the second phosphor. CASON phosphor is used as the third phosphor. The inventors research the relationship between the combination ratio of the phosphors and the color rendering indexes Rf, Rg in which the light having the color temperature of 2800 to 3200K is defined as the reference light.

Figure 2:
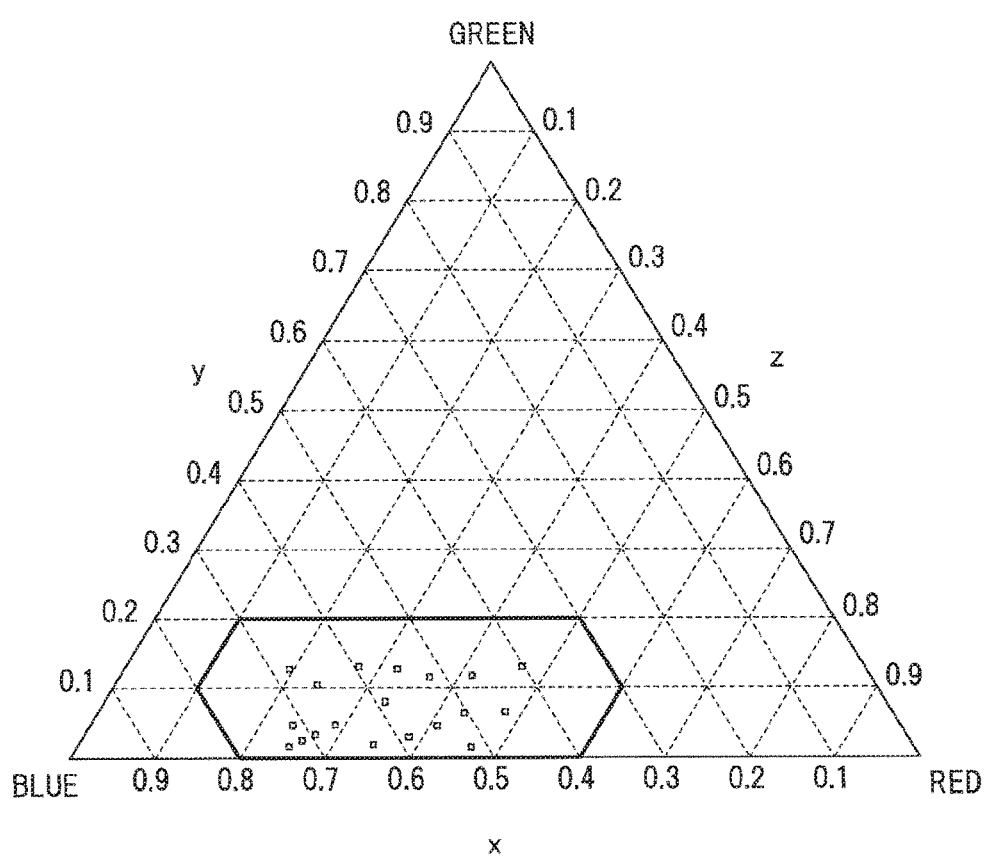
FIG. 2 is a ternary diagram showing combination ratio of a first phosphor, a second phosphor, and a third phosphor to a phosphor according to the embodiment.

FIG. 2 is a ternary diagram showing the combination ratio of the first phosphor, the second phosphor, and the third phosphor in the phosphor 15. "x" shown in FIG. 2 means the mass ratio x of the first phosphor to the total mass of the first, second, and third phosphors (it will be called as "the total mass" below). "y" shown in FIG. 2 means the mass ratio y of the second phosphor to the total mass. "z" shown in FIG. 2 means the mass ratio z of the third phosphor to the total mass.

Meanwhile, "BLUE", "GREEN", and "RED" described in the vertexes of the ternary diagram mean that according as closing to each vertex, emission color of the phosphor 15 is respectively closed to the blue, the green, or the red.

Figure 3:
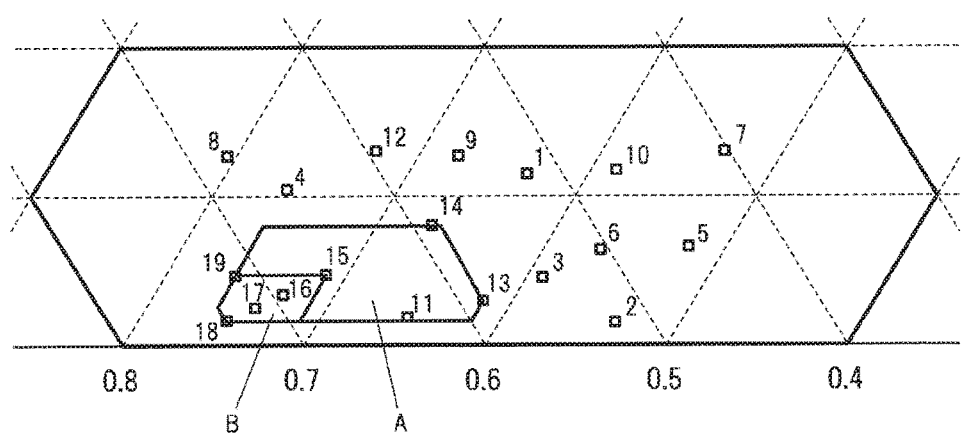
FIG. 3 is an enlarged view showing a hexagon region and surround thereof in the ternary diagram shown in FIG. 2 indicated by the heavy line.

FIG. 3 is an enlarged view showing a hexagon region and surround thereof shown by the heavy line in the ternary diagram shown in FIG. 2. Points shown in FIG. 3 indicate the combination ratio (the parameters indicating x, y, z) of the phosphor 15 whose color rendering indexes Rf, Rg are calculated. A number in a head of the string added to each point means the sample number of the phosphor 15. A number in brackets means the color rendering indexes Rf, Rg.

Next, the evaluated combination ratios x, y, z of the phosphor 15 and the color rendering indexes Rf, Rg will be shown in Table 4.

TABLE 4

| Sample No. | x | y | z | Rf | Rg |
|---|---|---|---|---|---|
| 1 | 0.519 | 0.115 | 0.366 | 86 | 87 |
| 2 | 0.521 | 0.016 | 0.464 | 72 | 113 |
| 3 | 0.545 | 0.046 | 0.409 | 79 | 108 |
| 4 | 0.656 | 0.105 | 0.239 | 70 | 74 |
| 5 | 0.454 | 0.066 | 0.479 | 71 | 109 |
| 6 | 0.504 | 0.064 | 0.432 | 77 | 106 |
| 7 | 0.402 | 0.130 | 0.467 | 74 | 101 |
| 8 | 0.678 | 0.127 | 0.195 | 57 | 62 |
| 9 | 0.551 | 0.127 | 0.322 | 87 | 89 |
| 10 | 0.468 | 0.118 | 0.414 | 81 | 99 |
| 11 | 0.634 | 0.019 | 0.347 | 85 | 107 |
| 12 | 0.595 | 0.130 | 0.275 | 74 | 76 |
| 13 | 0.586 | 0.030 | 0.384 | 85 | 105 |
| 14 | 0.589 | 0.081 | 0.330 | 89 | 100 |
| 15 | 0.664 | 0.048 | 0.288 | 94 | 99 |
| 16 | 0.694 | 0.034 | 0.272 | 95 | 101 |
| 17 | 0.714 | 0.026 | 0.260 | 96 | 100 |
| 18 | 0.734 | 0.017 | 0.249 | 94 | 99 |
| 19 | 0.714 | 0.047 | 0.239 | 97 | 100 |

The region A shown in FIG. 3 includes the phosphor 15 of the sample Nos. 11, 13 to 19. The combination ratios x, y, z of the phosphor 15 satisfy $0.586 \leq x \leq 0.734$, $0.017 \leq y \leq 0.081$, and $0.2395 \leq z \leq 0.384$ in the region A. The color rendering indexes Rf, Rg of the light emitted from the light emitting device 1 in which the light having the color temperature of 2800 to 3200K is defined as the reference light can respectively satisfy $Rf \geq 85$, and $93 \leq Rg \leq 107$ while the combination ratio is within the region A.

Meanwhile, as the combination ratio is within the region A, all of the color rendering indexes of 99 types of evaluation colors in TM-30-15 are not less than 56, and all of Rfh,1 to Rfh,16 are not less than 74. Rfh,1 to Rfh,16 are average value of color difference between the reference light and evaluation light included in each hue angle in dividing 99 types of the reference light into one sixteen by the hue angles.

The region B shown in FIG. 3 includes the phosphor 15 of the sample Nos. 15 to 19. The combination ratios x, y, z of the phosphor 15 satisfy $0.664 \leq x \leq 0.734$, $0.017 \leq y \leq 0.047$, and $0.239 \leq z \leq 0.288$ in the region B. The color rendering indexes Rf, Rg of the light emitted from the light emitting device 1 in which the light having the color temperature of 2800 to 3200K is defined as the reference light can respectively satisfy $Rf \geq 94$, and $99 \leq Rg \leq 101$ while the combination ratio is within the region B.

Also, as the combination ratio is within the region B, all of the color rendering indexes for 99 types of the evaluation colors in TM-30-15 are not less than 79, and all of Rfh,1 to Rfh,16 are not less than 86.

Meanwhile, the combination ratio of the first phosphor is low in the combination ratio of the phosphor 15 whose color rendering indexes Rf, Rg is high since the blue fluorescence is absorbed in the second phosphor that is the yellow-green phosphor, and the third phosphor that is the red phosphor. Also, the combination ratio of the third phosphor that is the red phosphor to the phosphor 15 is low in the combination ratio of the phosphor 15 whose color rendering indexes Rf, Rg is high since the emission intensity of the third phosphor that is the red phosphor is smaller than the emission intensity of the first phosphor that is the blue phosphor and the second phosphor that is the yellow-green phosphor in absorbing the same light.

Although the embodiments have been described, the invention is not intended to be limited to the embodiments. The various kinds of modifications can be implemented without departing from the gist of the invention.

Also, the claimed invention is not intended to be limited to the embodiments. Further, it should be noted that all combinations of the features described in the embodiments and the examples are not necessary to solve the problems of the invention.

What is claimed is:

1. A light emitting device, comprising:
   a first phosphor emitting a fluorescence having a peak emission wavelength of not less than 445 nm and not more than 490 nm;
   a second phosphor emitting a fluorescence having a peak emission wavelength of not less than 491 nm and not more than 600 nm;
   a third phosphor emitting a fluorescence having a peak emission wavelength of not less than 601 nm and not more than 670 nm; and
   a light emitting element that emits a light having a peak emission wavelength at a shorter wavelength side than the peak emission wavelength of the fluorescence emitted from the first phosphor,
   wherein $0.586 \leq x \leq 0.734$, $0.017 \leq y \leq 0.081$, $0.239 \leq z \times 0.384$ and $x+y+z=1$ are satisfied, where x, y, z are defined as mass ratios of the first, second and third phosphors, respectively, to a total mass of the first, second and third phosphors.

2. The light emitting device according to claim 1, wherein the light emitting device emits a light of which color rendering indexes Rf and Rg satisfy $Rf \geq 85$ and $93 \leq Rg \leq 107$, respectively, where a reference light is defined by a light having a color temperature of 2800 to 3200K.

3. The light emitting device according to claim 2, wherein the first phosphor comprises an alkaline earth halophosphate phosphor,
   wherein the second phosphor comprises a β-SiAlON phosphor, and
   wherein the third phosphor comprises a CASON phosphor.

4. The light emitting device according to claim 1, wherein x, y and z satisfy $0.664 \leq x \leq 0.734$, $0.017 \leq y \leq 0.047$ and $0.239 \leq z \leq 0.288$, respectively.

5. The light emitting device according to claim 4, wherein the light emitting device emits a light of which color rendering indexes Rf and Rg satisfy $Rf \geq 94$ and $99 \leq Rg \leq 101$, respectively, where a reference light is defined by a light having a color temperature of 2800 to 3200K.

6. The light emitting device according to claim 5, wherein the first phosphor comprises an alkaline earth halophosphate phosphor,
   wherein the second phosphor comprises a β-SiAlON phosphor, and
   wherein the third phosphor comprises a CASON phosphor.

7. The light emitting device according to claim 4, wherein the first phosphor comprises an alkaline earth halophosphate phosphor,
   wherein the second phosphor comprises a β-SiAlON phosphor, and
   wherein the third phosphor comprises a CASON phosphor.

8. The light emitting device according to claim 1, wherein the first phosphor comprises an alkaline earth halophosphate phosphor,
   wherein the second phosphor comprises a β-SiAlON phosphor, and
   wherein the third phosphor comprises a CASON phosphor.

* * * * *